United States Patent
Moczygemba (10) Patent No.: US 11,462,672 B2
(45) Date of Patent: Oct. 4, 2022

(54) VARIABLE BAND FOR THERMOELECTRIC MODULES

(71) Applicant: II-VI DELAWARE, INC., Wilmington, DE (US)

(72) Inventor: Joshua E. Moczygemba, Winona, TX (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 15/725,726

(22) Filed: Oct. 5, 2017

(65) Prior Publication Data

US 2018/0102468 A1 Apr. 12, 2018

Related U.S. Application Data

(60) Provisional application No. 62/405,618, filed on Oct. 7, 2016.

(51) Int. Cl.
*H01L 35/32* (2006.01)
*H01L 35/34* (2006.01)

(52) U.S. Cl.
CPC .............. *H01L 35/32* (2013.01); *H01L 35/34* (2013.01)

(58) Field of Classification Search
CPC ......... H01L 35/00; H01L 35/06; H01L 35/22; H01L 35/30; H01L 35/32; H01L 35/325; H01L 35/04; H01L 23/38; H01L 35/34; F01N 5/025; F01N 13/1811; F16L 33/04; F16L 33/06; F25B 21/02; F25B 21/04
USPC ................................................ 136/200–242
See application file for complete search history.

(56) References Cited

U.S. PATENT DOCUMENTS

| | | | | |
|---|---|---|---|---|
| 1,369,851 A | * | 3/1921 | Swaidmark | F16L 33/04 24/281 |
| 1,397,943 A | * | 11/1921 | Costello | F16L 33/04 24/275 |
| 1,455,067 A | * | 5/1923 | Berman | F16L 33/04 24/281 |
| 1,788,505 A | * | 1/1931 | Beard | F16L 33/04 24/281 |
| 5,031,689 A | * | 7/1991 | Jones | H01L 35/32 136/204 |
| 6,027,256 A | | 2/2000 | Nightingale et al. | |
| 6,438,964 B1 | | 8/2002 | Giblin | |
| 2006/0266404 A1 | * | 11/2006 | Hiller | H01L 35/22 136/205 |
| 2007/0283709 A1 | | 12/2007 | Luse et al. | |

(Continued)

FOREIGN PATENT DOCUMENTS

| KR | 20150007827 A | * | 1/2015 |
|---|---|---|---|
| KR | 20160077078 A | | 7/2016 |

OTHER PUBLICATIONS

KR-20150007827-A English machine translation (Year: 2015).*

(Continued)

*Primary Examiner* — Andrew J Golden
(74) *Attorney, Agent, or Firm* — Blank Rome LLP (57) ABSTRACT

A system comprises a thermoelectric device, and a baseplate coupled to a first side of the thermoelectric device. The system also comprises a band coupled to the baseplate and a container. The band may be adjustable in a circumference and configured to thermally couple the baseplate and the container.

21 Claims, 4 Drawing Sheets

(56) References Cited

U.S. PATENT DOCUMENTS

| | | | |
|---|---|---|---|
| 2009/0000309 A1* | 1/2009 | Hershberger | H01L 35/30 62/3.5 |
| 2010/0198322 A1 | 8/2010 | Joseph et al. | |
| 2011/0035907 A1* | 2/2011 | Cousineau | F01N 13/1805 24/19 |
| 2013/0213448 A1* | 8/2013 | Moczygemba | H01L 35/32 136/201 |
| 2014/0096808 A1* | 4/2014 | Moczygemba | H01L 35/30 136/205 |
| 2018/0005917 A1* | 1/2018 | Tang | H01L 23/3736 |

OTHER PUBLICATIONS

PCT International Search Report, International Application No. PCT/US2017/055310 (3 pages) dated Jan. 10, 2018.
PCT Written Opinion of the International Searching Authority, International Application No. PCT/US2017/055310 (7 pages) dated Jan. 10, 2018.

* cited by examiner

VARIABLE BAND FOR THERMOELECTRIC MODULES

RELATED APPLICATION

This application claims benefit under 35 U.S.C. § 119(e) of U.S. Provisional Application Ser. No. 62/405,618, titled "Variable Band for Thermoelectric Modules," filed Oct. 7, 2016 by Joshua E. Moczygemba.

TECHNICAL FIELD

This disclosure relates generally to power sources and more particularly to a variable band for thermoelectric modules.

BACKGROUND

The basic theory and operation of thermoelectric devices has been developed for many years. Presently available thermoelectric devices used for cooling typically include an array of thermocouples that operate in accordance with the Peltier effect. Thermoelectric devices may also be used for heating, power generation and temperature sensing.

Thermoelectric devices may be described as essentially small heat pumps that follow the laws of thermodynamics in the same manner as mechanical heat pumps, refrigerators, or any other apparatus that is used to transfer heat energy. A principal difference is that thermoelectric devices function with solid state electrical components (thermoelectric elements or thermocouples) as compared to more traditional mechanical/fluid heating and cooling components. Current power generation techniques using thermoelectric devices are limited.

SUMMARY

In one embodiment, a system comprises a thermoelectric device, and a baseplate coupled to a first side of the thermoelectric device. The system also comprises a band coupled to the baseplate and a container. The band may be adjustable in a circumference and configured to thermally couple the baseplate and the container.

In a certain embodiment, a method includes coupling a baseplate to a first side of a thermoelectric device. The method further includes coupling a band to the baseplate and a container. The band may be adjustable in a circumference and configured to thermally couple the baseplate and the container.

In one embodiment, a system comprises a thermoelectric device, and a baseplate coupled to a first side of the thermoelectric device. The system also comprises a band coupled to the baseplate and a container. The band may be adjustable in a circumference and configured to thermally couple the baseplate and the container. The system also includes a fastener coupled to the band. The fastener may be configured to thermally couple the baseplate and the container. Also, the system includes a thermal collector coupled to the band and the container. The thermal collector may be configured to thermally couple the baseplate and the container. Finally, the system includes a controller coupled to the thermoelectric device.

Depending on the specific features implemented, particular embodiments may exhibit some, none, or all of the following technical advantages. The system may allow for a substantial amount of power to be generated (e.g., watts of power). Heated pipes may not be necessary in order to provide power in the system. The system may not necessitate changes to a pipe in order to generate power using pipe. The system may integrate multiple power sources (e.g., power generated from thermoelectric devices and power generated from the sun) to provide power for various applications. In some embodiments, the band is adjustable in length, which allows one band to cover a large array of pipe sizes and allow for flexibility if the pipe undergoes thermal expansion. Thermoelectric devices may operate efficiently by being secured to a container such that thermal transfer between the thermoelectric device and the container is facilitated.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

Reference is now made to the following description taken in conjunction with the accompanying drawings, wherein like reference numbers represent like parts and which.

DETAILED DESCRIPTION

Figure 1:
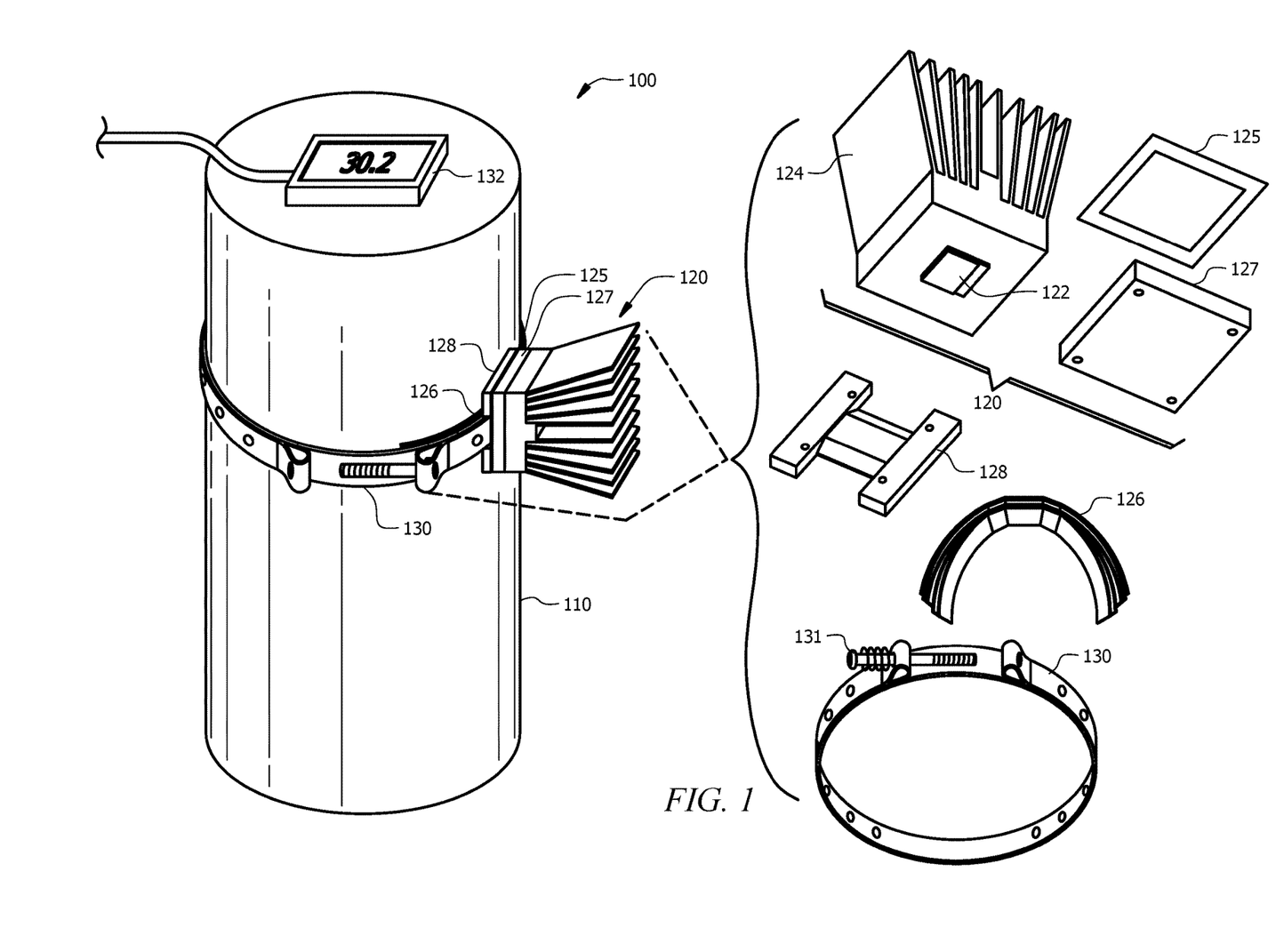
FIG. 1 illustrates one embodiment of a system for generating power.

FIG. 1 illustrates one embodiment of system 100 for generating power. System 100 includes pipe 110 and a single or multiple thermoelectric modules 120 thermally coupled to pipe 110 using band 130, base plate coupler 128, thermal collector 126, baseplate 127, gasket 125, and controller 132. One or more of the thermoelectric modules 120 can include thermoelectric device 122 coupled in compression between sink 124 and baseplate 127. In operation, a medium (e.g., liquid or gas) may flow through pipe 110 and may be at a temperature that is different than the environment surrounding pipe 110. Baseplate 127 may be coupled to thermoelectric device 122 such that it transfers heat from pipe 110 to thermoelectric device 122. Band 130 may be configured to keep baseplate 127 and pipe 110 in thermal contact. Thermoelectric modules 120 may convert the temperature difference between the medium in pipe 110 and the surrounding environment into electrical power according to the Seebeck effect. System 100 may include any suitable number of pipes 110 as well as any suitable number of bands 130 on each pipe 110. Each band 130 may include any suitable number of thermoelectric modules 120. The number of bands 130 and/or thermoelectric modules 120 used in system 100 may be determined based on power requirements of the application(s) using the electrical power generated by thermoelectric modules 120. Multiple bands 130 may be placed on pipe 110 and each of them can include one or more thermoelectric modules 120.

In some embodiments, system 100 may be useful in various operations, such as power generation operations (as discussed above) or in heating and/or cooling applications.

In power generation operations, controller 132 may be configured to manage the raw power created by thermoelectric device 122. For example, controller 132 may be a battery charger controller. In cooling applications, pipe 110 may represent a container of material (e.g., gasoline or fuel) that should be kept within a certain temperature range. Controller 132 may be configured to send electrical signals to thermoelectric modules 120 to cause the side of thermoelectric modules 120 that interface with band 130 to become hot or cold. In such a configuration, thermoelectric modules 120 may serve to lower or raise the temperature of the material within the container as desired. The transfer of heat is facilitated by band 130 holding thermoelectric module 120 in good thermal contact with pipe 110. Controller 132 may receive signals indicating the temperature of the material in the container (depicted as pipe 110) and adjust the temperature using thermoelectric modules 120 coupled to band 130 by sending appropriate signals to thermoelectric modules 120 that cause the sides of thermoelectric modules 120 to become hot or cold. In some embodiments, controller 132 may be coupled to thermoelectric modules 120 such that it may use the power generated by thermoelectric modules 120. In some embodiments, system 100 may generate power and include a cable coupled to system 100. The cable may be configured to transfer power from system 100 to a source requiring power (e.g., battery, sensor, controller).

Pipe 110 is an example of a container; various containers may be used in system 100 in place of pipe 110. In some embodiments, pipe 110 is configured to store a material or medium that can have a temperature that is different than the environment surrounding pipe 110. As examples, pipe 110 can store or transport hot solids, hot fluids, hot gasses, cold solids, cold fluids, and cold gasses. Pipe 110 may be an exhaust pipe. While depicted as cylindrical in shape, pipe 110 may be in any suitable shape or configuration (e.g., rectangular prism or other types of prisms). As an example, pipe 110 may be between 2 and 36 inches in diameter. Pipe 110 may be situated in any suitable medium including without limitation a vacuum (e.g., in a fuel line), open air, sea water, fresh water, or oil. Pipe 110 may be situated in a high pressure environment (e.g., deep sea water). Pipe 110 may be a storage container. In some embodiments, baseplate 127 may be kept in good thermal contact with pipe 110, such that heat is transferred from pipe 110 to baseplate 127.

In some embodiments, thermoelectric modules 120 may be configured for optimum or near optimum performance. For example, thermoelectric device 122 may be thermally matched to sink 124. This may aid in optimizing the electrical power generation of thermoelectric module 120. As another example, an individual thermoelectric module 120 may be impedance matched with a node it is electrically coupled to (e.g., another thermoelectric module 120 or an electrical circuit). This may aid in optimizing the transfer of electrical power generated by thermoelectric modules 120. Sink 124 may be a heat sink or a cold sink. Sink 124 may be coupled to one side of thermoelectric device (e.g., the side away from pipe 110). In some embodiments, baseplate 127 may be coupled to another side of thermoelectric device 122 (e.g., the side close to pipe 110). Although depicted in FIG. 1 with a particular shape, this should not be construed as limiting, as sink 124 may take any shape operable to exchange heat from pipe 110 to the environment surrounding pipe 110. Sink 124 may be anodized in some embodiments. Anodization may decrease corrosion of sink 124 and facilitate thermal radiation. For example, when sink 124 is a heat sink, sink 124 may be anodized with black aluminum in order to increase heat radiation out from thermoelectric device 122. In some embodiments, suitable sealing techniques may be used to protect thermoelectric module 120 from environmental exposure (e.g., exposure to water, rain, snow, ice, dirt, and/or other debris). For example, gasket 125 may be placed between sink 124 and baseplate 127 and around thermoelectric device 122 such that thermoelectric device 122 is protected from exposure. As another example, the perimeter of thermoelectric module 120 may be sealed using a sealant. The sealant may be capable of withstanding high temperatures (e.g., over 100 degrees Celsius). For example, the sealant may be implemented using room temperature vulcanization (RTV) silicone. Using sealing techniques may reduce heat loss and/or increase power output of system 100.

In some embodiments, band 130 may be configured in any suitable shape in order to thermally couple thermoelectric module 120 to pipe 110. Band 130 may be formed of a continuous piece of material or be formed by linking together individual pieces that are configured to receive thermoelectric modules 120. For example, FIG. 1 illustrates band 130 comprising a circular band, a separate slotted strap, and fastener 131 (e.g., a locknut or a clamp), that may be clamped around pipe 110. The slotted strap and fastener 131 allows band 130 to be adjustable such that it can be clamped around pipes 110 of different sizes and circumferences. Band 130 illustrated in FIG. 1 may be, for example, one developed by Clampco®. In some embodiments, band 130 may include fastener 131 that allows band 130 to be adjustable in length to cover a large array of pipe sizes (e.g., 2" to 14"). In some embodiments, band 130 is spring loaded (e.g., fastener 131 has spring loaded bolts) to allow for flexibility if pipe 110 undergoes thermal expansion. If band 130 is spring loaded, it is able to maintain compression and thermal contact during expansion or contraction of pipe 110.

In some embodiments, band 130 may come in a range of sizes to accommodate various sizes of pipes 110. For example, band 130 may have a large size that can accommodate pipes 110 of sizes 6 inches to 14 inches and a small size that can accommodate pipes 110 of sizes 2 inches to 6 inches. In some embodiments band 130 may include a series of holes spaced apart by a certain distance (e.g., .5", 1") such that band 130 is adjustable and allows for custom fitting to a range of sizes of pipe 110. The hole locations in band 130 may correspond to various sizes of pipe 110. For example, the first hole may indicate a 6" nominal pipe size (NPS), while the eighth hole indicates a 8" NPS, a tenth hole indicates a 10" NPS, etc. In some embodiments, a T-bolt may be inserted into the hole of band 130 that corresponds to the appropriate size of pipe 110, and the excess part of band 130 (e.g., length extending beyond the selected hole of band 130), may be folded inward, then trimmed and/or removed before it is bolted, as described below.

In some embodiments, the spring-loaded bolts and/or adjustable length of band may allow band 130 to flex. This may allow band 130 to better conform to pipe 110. For example, pipe 110 may expand or contract depending on its content; band 130 may flex with the changes in pipe 110 so as to benefit performance. As another example, pipe 110 may include non-uniformities in its shape; and band 130 may flex so that band 130 maintains good contact with pipe 110 in areas that include non-uniformities.

Having flexible and/or adjustable bands 130 reduces or eliminates the need to have a custom band for each size or type of pipe 110. Thus a large inventory comprising multiples bands 130 in different sizes to accommodate different pipe diameters may not need to be maintained. Another example for the configuration of an adjustable band 130 is described below in reference to FIG. 2.

In some embodiments, the side of band 130 configured to interface with thermoelectric module 120 may be substantially flat while the side of band 130 configured to interface with pipe 110 may be curved. Base plate coupler 128 accommodates this transition and allows for better thermal mating between band 130 and pipe 110; this can lead to decreased thermal resistance between pipe 110 and thermoelectric module 120, thus increasing performance. In some embodiments, band 130 may comprised of stainless steel, or any suitable material.

In some embodiments, base plate coupler 128 may be configured to thermally couple band 130 and baseplate 127. Base plate coupler 128 may include fasteners (e.g., bolts, screws) that facilitate coupling it to base plate 127. Base plate coupler 128 may hold band 130 and thermal collector 126 in compression such that they are in thermal contact with baseplate 127. In some embodiments, a portion of the band (e.g., part of its full length) is between the base plate coupler 128 and the baseplate 127. Base plate coupler 128 may be any material suitable for facilitating thermal coupling, including machined aluminum, copper, brass, and/or stainless steel.

In some embodiments, thermal collector 126 may comprise multiple conductive plates (e.g., strips of aluminum) in a stacked arrangement (e.g., similar to a "leaf spring") or may comprise a single, conformable, conductive plate. In some embodiments, thermal collector 126 may be variable in length to accommodate different circumferences of pipe 110. Thermal collector 126 may be used to reduce thermal resistance at pipe 110 interface (e.g., hot and cold interfaces). Other examples of how thermal collector 126 may be implemented include thermal paste, solder, epoxy, thermal mastic, and metal foils (e.g., indium foil). In some embodiments, thermal collector 126 may be any material suitable for facilitating thermal transfer. For example, thermal collector 126 may be any thermally conductive material (e.g., copper, aluminum, brass, stainless steel, conductive polymers, flexible ceramics, graphite with adhesive, graphite without adhesive, deformable fluid filled bag). Thermal collector 126 may further comprise a thermal interface material (TIM) between conductive layers. The thermal interface material may be comprised of graphite pads (e.g., a GRAFOIL thermal pad), copper mesh, conductive polymer layer, thermal grease, mastic, and/or adhesives. Such a pad may be thick enough (e.g., 1 millimeter) to accommodate minor variation in surface flatness (e.g., of pipe 110 of FIG. 1 or of base plate coupler 128 or base plate 127), but thin enough (e.g., 0.5 millimeters) not to detrimentally affect performance of thermoelectric module 120. Any pads or other thermal interface material included between the layers of conductive plates may minimize air gaps between the plates, thus facilitating heat transfer. In some embodiments, thermal collector 126 may be coated such that it is protected from the environment or oxidation (e.g., anodization, alodine, paint, polymer-based coating).

In some embodiments, thermal collector 126 may be situated between pipe 110 and band 130. The flexibility of thermal collector 126 can facilitate heat transferring from pipe 110 to thermal collector 126 to band 130 and to thermoelectric module 120. Further, in some embodiments, thermal collector 126 is conformable such that it can conform to the pipe 110 shape and accommodate thermal expansion of pipe 110, while keeping pipe 110 and thermoelectric module 120 thermally coupled. Similarly, the flexibility of thermal collector 126 can facilitate heat transferring from pipe 110 to thermoelectric module 120.

Figure 2:
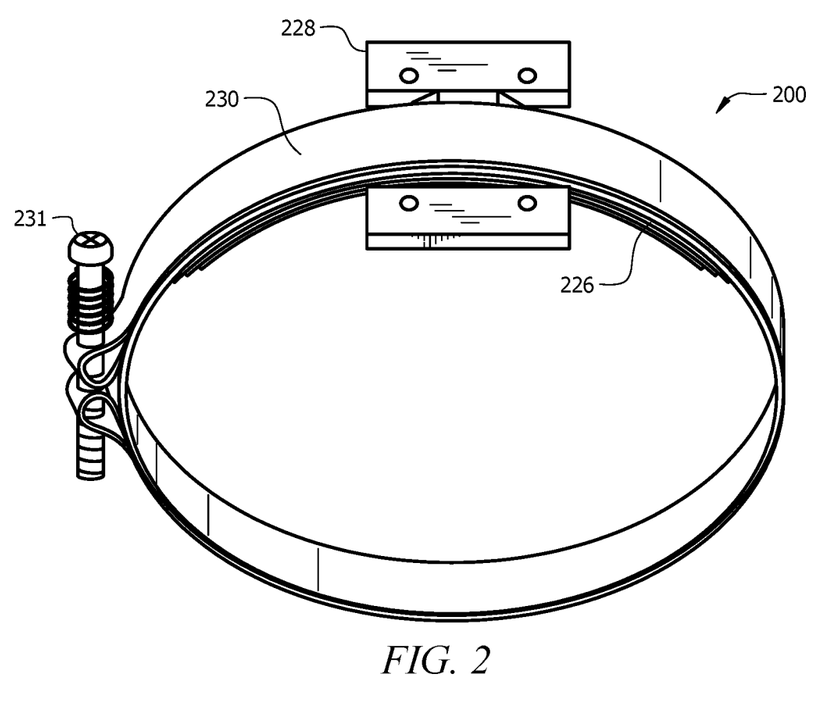
FIG. 2 illustrates one embodiment of a band used in the system of FIG. 1.

FIG. 2 illustrates one embodiment of band 230 that can be used to implement band 130 of FIG. 1. FIG. 2 shows an arrangement of band 230, base plate coupler 228, and thermal collector 226. Band 230 may be configured such that it is attached to the exterior (e.g., side facing away from pipe 110 and towards thermoelectric module 120 of FIG. 1) face of base plate coupler 228. Band 230 may be placed around base plate coupler 228 such that band 230 would be situated between base plate coupler 228 and a base plate (e.g., base plate 127 of FIG. 1). In some embodiments, thermal collector 226 may be similar to thermal collector 126 described above for FIG. 1. Thermal collector 226 may be situated between base plate coupler 228 and band 230, which allows thermal collector 226 to be held in compression for good thermal contact with pipe 110.

Figure 3:
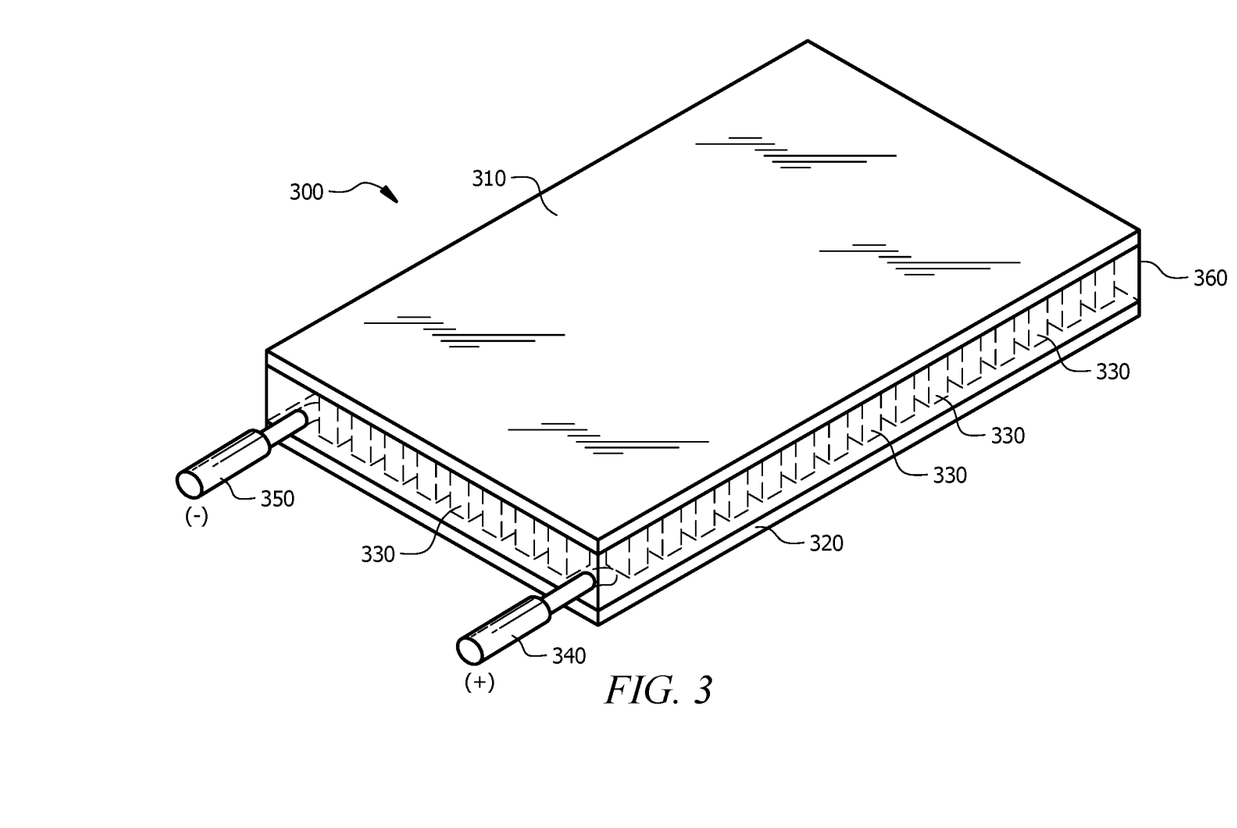
FIG. 3 illustrates an embodiment of a thermoelectric device suitable for use in the system of FIG. 1.

FIG. 3 illustrates an embodiment of thermoelectric device 300 suitable for use in system 100 of FIG. 1. The examples discussed below regarding thermoelectric device 300 may be used to implement thermoelectric device 122 of FIG. 1. Thermoelectric device 300 includes a plurality of thermoelectric elements 330 disposed between plates 310. Electrical terminals 340 are provided to allow thermoelectric device 300 to be electrically coupled with to one or more devices that use, transform, or store power. In some embodiments, thermoelectric elements 330 fabricated from dissimilar semiconductor materials such as N-type thermoelectric elements and P-type thermoelectric elements. Thermoelectric elements 330 are typically configured in a generally alternating N-type element to P-type element arrangement and typically include an air gap disposed between adjacent N-type and P-type elements. In many thermoelectric devices, thermoelectric materials with dissimilar characteristics are connected electrically in series and thermally in parallel.

Examples of thermoelectric devices and methods of fabrication are shown in U.S. Pat. No. 5,064,476 titled Thermoelectric Cooler and Fabrication Method; U.S. Pat. No. 5,171,372 titled Thermoelectric Cooler and Fabrication Method; and U.S. Pat. No. 5,576,512 titled Thermoelectric Apparatus for Use With Multiple Power Sources and Method of Operation.

N-type semiconductor materials generally have more electrons than would be found in the associated ideal crystal lattice structure. P-type semiconductor materials generally have fewer electrons than would be found in the associated ideal crystal lattice structure. The "missing electrons" are sometimes referred to as "holes." The extra electrons and extra holes are sometimes referred to as "carriers." The extra electrons in N-type semiconductor materials and the extra holes in P-type semiconductor materials are the agents or carriers that transport or move heat energy between plates 310 through thermoelectric elements 330 when subject to a DC voltage potential. These same agents or carriers may generate electrical power when an appropriate temperature difference is present between plates 310. Terminals 340 may be coupled to one of plates 310 in a manner that withstands high temperature environments, such as resistance welding, tungsten inert gas (TIG) welding, and laser welding.

In some embodiments, thermoelectric elements 330 may include high temperature thermoelectric material. Examples of high temperature thermoelectric materials include lead telluride (PbTe), lead germanium telluride (PbxGe1-xTe), TAGS alloys (such as (GeTe)0.85(AgSbTe2)0.15), bismuth telluride (Bi2Te3) based alloys, and skutterudites.

In some embodiments, thermoelectric elements 330 may include a diffusion barrier that includes refractory metals (e.g., a metal with a melting point above 1,850° C.). Suitable refractory metals may include those that are metallurgically compatible with high temperature thermoelectric materials and metallurgically compatible with other components of thermoelectric device 300. For example, a molybdenum diffusion barrier may be used. This may be advantageous in that molybdenum may be metallurgically compatible with various aspects of thermoelectric device 300. For example, as further discussed below, thermoelectric device 300 may include an aluminum braze that is metallurgically compatible with a molybdenum diffusion barrier. Such a diffusion barrier may prevent or reduce the chance or occurrence of Kirkendall voiding in thermoelectric device 300. Other suitable examples of diffusion barrier materials that could have similar properties to molybdenum include tungsten and titanium.

In some embodiments, alternating thermoelectric elements 330 of N-type and P-type semiconductor materials may have their ends connected by electrical conductors. Conductors may be metallizations formed on thermoelectric elements 330 and/or on the interior surfaces of plates 310. Conductors may include aluminum. Ceramic materials may be included in plates 310 which define in part the cold side and hot side, respectively, of thermoelectric device 300. In some embodiments, the ceramic materials may provide electrical isolation from hot and cold side sources. Aluminum metallized ceramics may accommodate thermal stresses (i.e., due to high temperature exposure) of the ceramic/aluminum bond. Examples of suitable ceramic materials include anodized aluminum, aluminum oxide, aluminum nitride, and beryllium oxide.

In some embodiments, thermoelectric elements 330 may be coupled to plates 310 using a medium. The Medium may include brazes and/or solders. For example, aluminum-based brazes and/or solders may be used, such as aluminum-silicon (Al—Si) braze family and/or zinc-aluminum (Zn—Al) solder. In some embodiments, using such brazes and/or solders may provide for high temperature operation and allow for flexible joints. Kirkendall voiding may be prevented or reduced.

In some embodiments, using one or more of the configurations discussed above, thermoelectric device 300 may be suitable as a fixed-joint, high temperature thermoelectric generator that is capable of being used in high temperature applications. For example, a thermoelectric generator built using skutterudite thermoelectric elements that include molybdenum diffusion barriers, conductors formed by aluminum metallizations, and aluminum based brazes may result in a device that can operate with at least one of its plates (such as plate 310) in an ambient temperature greater than 500 degrees Celsius. As another example, a thermoelectric generator built using bismuth telluride thermoelectric elements that include a molybdenum diffusion barrier, conductors formed by aluminum metallizations, and zinc-aluminum (ZnAl) solder may result in a device that can operate with at least one of its plates (such as plate 310) at an ambient temperature greater than 300 degrees Celsius.

As another example, a thermoelectric generator built using bismuth telluride thermoelectric elements that include a nickel diffusion barrier, conductors formed by copper metallizations, and lead-based solder may result in a device that can operate with at least one of its plates (such as plates 310).

Figure 4:
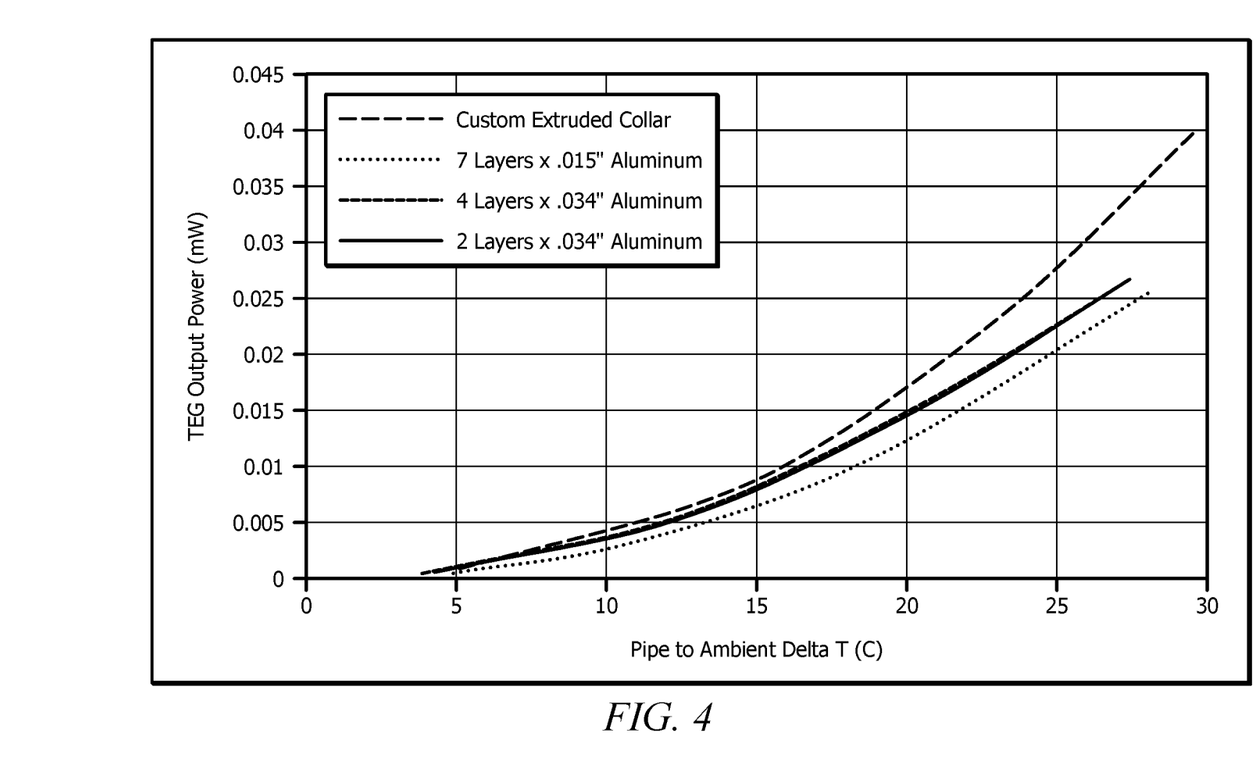
FIG. 4 illustrates a chart depicting an example of performance characteristics of embodiments of thermoelectric generators thermally coupled to a container using one or more bands.

FIG. 4 illustrates a chart depicting an example of performance characteristics (based on models and experiments) of embodiments of thermoelectric module 120 thermally coupled to a container (e.g., pipe 110 of FIG. 1) using one or more bands (e.g., band 130 of FIG. 1). Chart 400 depicts the power output of four different thermoelectric assemblies (e.g., modules 120 of FIG. 1) using different configurations of bands (e.g., band 130 of FIG. 1 and band 230 of FIG. 2). Chart 400 is the result of experiments where thermoelectric modules were tested under similar conditions, such as, with natural convection and in an ambient room temperature. The custom extruded collar represents a band that is custom-made for a specific pipe diameter and without using any thermal collector. The other bands tested are adjustable and can accommodate pipes of different diameters as described above. These adjustable bands tested used a varying number of layers and thicknesses of thermal collector (e.g., thermal collector 126 of FIG. 1 or thermal collector 226 of FIG. 2). For example, chart 400 shows the bands with the following properties that were tested:

| Band Configuration | Number of Layers | Thickness of each layer |
| --- | --- | --- |
| 1 | 7 layers | .015" |
| 2 | 4 layers | .034" |
| 3 | 2 layers | .034" |

Chart 400 illustrates that thermoelectric modules with different layers and thicknesses achieve similar performance in power output as a custom extruded collar.

Depending on the specific features implemented, particular embodiments may exhibit some, none, or all of the following technical advantages. System 100 may allow for a substantial amount of power to be generated (e.g., watts of power). Heat pipes may not be necessary in order to transfer heat in system 100. System 100 may not necessitate changes to pipe 110 in order to generate power using pipe 110. System 100 may integrate multiple power sources (e.g., power generated from thermoelectric devices and power generated from the sun) to provide power for various applications. Other technical advantages will be readily apparent to one skilled in the art from the preceding figures and description as well as the proceeding claims. Particular embodiments may provide or include all the advantages disclosed, particular embodiments may provide or include only some of the advantages disclosed, and particular embodiments may provide none of the advantages disclosed.

Although several embodiments have been illustrated and described in detail, it will be recognized that modifications and substitutions are possible without departing from the spirit and scope of the appended claims.

What is claimed is:

1. A system for use on an object in a surrounding environment, the object having an external surface, the system comprising:
   a coupler being thermally conductive and having an inside surface and an outside surface, the inside surface configured to place in thermal contact with the external surface of the object, the outside surface facing away from the external surface of the object;
   a plurality of stacked plates, each of the plurality of stacked plates being made of a same thermally conductive material and disposed in a stacked arrangement adjacent one another, a central portion of the stacked plates disposed in thermal contact with the outside surface of the coupler, wing portions of the stacked plates configured to place in thermal contact with portions of the external surface of the object;

a band being thermally conductive and disposed about the object, the band configured to hold the stacked plates and the coupler in compression against the external surface;

a baseplate being thermally conductive and disposed in thermal contact to the coupler, the band, and the stacked plates; and a thermoelectric device having a first side and a second side, the first side disposed in thermal contact with the baseplate, the thermoelectric device being configured to thermoelectrically transfer energy between the first and second sides thereof.

2. The system of claim 1, wherein the band comprises:
a continuous piece of material being adjustable in a circumference through a series of holes spaced about the circumference; and
a fastener coupled to the band.

3. The system of claim 1, further comprising a thermal interface material disposed between adjacent ones of the stacked plates and being configured to facilitate transfer of thermal energy.

4. The system of claim 3, wherein the thermal interface material comprises graphite thermal pads.

5. The system of claim 1, further comprising a sink coupled to the second side of the thermoelectric device, the sink configured to exchange thermal energy between the thermoelectric device and the surrounding environment.

6. The system of claim 1, further comprising a gasket coupled to the baseplate and configured to protect the thermoelectric device.

7. The system of claim 1, further comprising a thermal interface material coupled to the baseplate and the stacked plates and being configured to facilitate transfer of thermal energy.

8. The system of claim 1, further comprising a controller coupled to the thermoelectric device and configured to transfer electrical energy to or from the thermoelectric device.

9. The system of claim 8, wherein the controller is configured to send signals to the thermoelectric modules that cause the baseplate to change temperature.

10. The system of claim 1, wherein the stacked plates are stacked in a leaf spring arrangement; wherein the stacked plates are clamped together between the coupler and the band; and/or wherein the stacked plates are clamped to one another at the central portion between the coupler and the band.

11. The system of claim 1, wherein to thermoelectrically transfer energy between the first and second sides, the thermoelectric device is configured to: transfer thermal energy from the first side to the second side in response to input of electrical energy, transfer thermal energy from the second side to the first side in response to input of electrical energy, or generate electrical energy in response to the transfer of thermal energy between the first and second sides.

12. The system of claim 1, the external surface being circumferential, wherein the inside surface of the coupler defines a concave surface configured to place against the circumferential surface of the object; and wherein the outside surface of the coupler defines a convex surface, the stacked plates and the band being configured to conform to the convex surface.

13. A method for use on an object in a surrounding environment, the object having an external surface, the method comprising, not necessarily in sequence:

placing a first side of a thermoelectric device in thermal contact with a baseplate, the thermoelectric device having a second side;

placing central portions of conductive plates in a stacked arrangement against an outside surface of a coupler, each of the conductive plates being made of a same thermally conductive material;

placing a portion of a band against the conductive plates;

coupling the coupler to the baseplate with the central portions of the conductive plates and the portion of the band positioned therebetween;

attaching the coupler, the conductive plates, the band, and the baseplate to the object by: placing an inside surface of the coupler in thermal contact with the external surface of the object, placing wing portions of the stacked plates in thermal contact with the external surface of the object, and affixing the band around the external surface of the object; and thermoelectrically transferring energy between the first and second sides of the thermoelectric device.

14. The method of claim 13, further comprising placing a thermal interface material between adjacent conductive plates, the thermal interface material being configured to facilitate transfer of thermal energy.

15. The method of claim 13, further comprising placing a sink in thermal contact with the second side of the thermoelectric device; and exchanging thermal energy between the thermoelectric device and the surrounding environment using the sink.

16. The method of claim 13, further comprising protecting the thermoelectric device by coupling a gasket to the baseplate.

17. The method of claim 13, further comprising placing a thermal interface material between adjacent ones of the conductive plates, the thermal interface material being configured to facilitate transfer of thermal energy.

18. The method of claim 13, wherein thermoelectrically transferring the energy between the first and second sides of the thermoelectric device comprises transferring electrical energy to or from the thermoelectric device using a controller.

19. The method of claim 13, wherein thermoelectrically transferring the energy between the first and second sides of the thermoelectric device comprises: transferring thermal energy from the first side to the second side in response to input of electrical energy, transferring thermal energy from the second side to the first side in response to input of electrical energy, or generating electrical energy in response to the transfer of thermal energy between the first and second sides.

20. The method of claim 13, the external surface being circumferential, wherein placing the inside surface of the coupler in thermal contact with the external surface of the object comprises placing a concave surface of the coupler against the circumferential surface of the object; and wherein placing the central portions of the conductive plates in the stacked arrangement against the outside surface of the coupler comprises placing the central portions against a convex surface of the coupler.

21. The system of claim 1, wherein the coupler comprises:
a central portion, the outside surface of the central portion having a generally convex curvature configured to conformance fit an inner surface of the stacked arrangement of the plurality of stacked plates; and two elongated strips on opposing sides of the central portion, the two elongated having lengths longer than the length of the central portion and outside surfaces configured to couple with the baseplate.

* * * * *